(12) United States Patent
Golden et al.

(10) Patent No.: US 7,863,980 B2
(45) Date of Patent: Jan. 4, 2011

(54) AMPLIFIERS WITH NEGATIVE CAPACITANCE CIRCUITS

(75) Inventors: Philip V. Golden, Menlo Park, CA (US); Peter J. Mole, St Albans (GB)

(73) Assignee: Intersil Americas Inc., Milpitas, CA (US)

( * ) Notice: Subject to any disclaimer, the term of this patent is extended or adjusted under 35 U.S.C. 154(b) by 0 days.

(21) Appl. No.: 12/475,409

(22) Filed: May 29, 2009

(65) Prior Publication Data

US 2009/0243720 A1 Oct. 1, 2009

Related U.S. Application Data

(62) Division of application No. 11/567,114, filed on Dec. 5, 2006, now Pat. No. 7,609,111.

(51) Int. Cl.
*H03F 1/26* (2006.01)
(52) U.S. Cl. ...................... 330/149; 330/302
(58) Field of Classification Search ................. 330/149, 330/302
See application file for complete search history.

(56) References Cited

U.S. PATENT DOCUMENTS

| | | | |
|---|---|---|---|
| 4,215,312 A | 7/1980 | Takayama | |
| 4,296,392 A | 10/1981 | Lee | |
| 4,885,548 A * | 12/1989 | Wakimoto et al. | ........... 330/260 |
| 5,475,343 A | 12/1995 | Bee | |
| 5,640,112 A | 6/1997 | Goto et al. | |
| 5,920,235 A | 7/1999 | Beards et al. | |
| 6,078,218 A | 6/2000 | Hirabayashi et al. | |
| 6,785,477 B1 | 8/2004 | Masuda et al. | |
| 6,943,633 B2 | 9/2005 | Singh | |
| 7,496,155 B1 * | 2/2009 | Lu et al. | ........................ 375/326 |
| 7,609,111 B2 * | 10/2009 | Golden et al. | ................ 330/149 |

OTHER PUBLICATIONS

Nauta, B., "A CMOS Transconductance -C Filter Technique for Very High Frequencies," IEEE J. of Solid-State Circuits, vol. 27, No. 2 (Feb. 1992), pp. 142-153.

* cited by examiner

*Primary Examiner*—Patricia Nguyen
(74) *Attorney, Agent, or Firm*—Fliesler Meyer LLP

(57) ABSTRACT

Provided herein are amplifiers including negative capacitance circuits for reducing distortion resulting from a gate-source (or base-emitter) capacitance of output stages of such amplifiers. Such a negative capacitance circuit is connected in parallel with the gate-source (or base-emitter) capacitance of the output stage to shunt the gate-source (or base-emitter) capacitance and thereby reduce distortion. Also provided herein are methods for use with amplifiers including an output stage, including connecting a negative capacitance circuit in parallel with a base-emitter capacitance of the output stage.

20 Claims, 9 Drawing Sheets

100' Negative Capacitance Circuit

300' Negative Capacitance Circuit

US 7,863,980 B2

AMPLIFIERS WITH NEGATIVE CAPACITANCE CIRCUITS

PRIORITY CLAIM

The present application is a divisional of and claims priority to U.S. Pat. No. 11/567,114, entitled "Negative Capacitance Synthesis", which was filed Dec. 5, 2006, and which is incorporated herein by reference.

FIELD OF THE INVENTION

The present invention relates to circuits, and more particularly to circuits that generate a negative capacitance for the purpose of improving the linearity of an output stage.

BACKGROUND OF THE INVENTION

Parasitic capacitances of an output stage may result in undesirable distortion (i.e., nonlinearity) of the output stage. This is undesirable where the output stage is part of, e.g., an amplifier. Where the output stage is a MOS type output stage, the primary contributor to such parasitic capacitances is the gate-source capacitance of MOS transistor(s). Where the output stage is a BJT type output stage, the primary contributor to such parasitic capacitance is the base-emitter capacitance of BJT transistor(s). There is desire and need to reduce and preferably eliminate, or at least minimize, such distortion to improve the linearity of output stages.

SUMMARY OF PRESENT INVENTION

Embodiments of the present invention relate to circuits that generate a negative capacitance for the purpose of improving the linearity of an output stage. In accordance with specific embodiments of the present invention, such a negative capacitance circuit is connected in parallel with the gate-source (or base-emitter) capacitance of an output stage to shunt the gate-source (or base-emitter) capacitance and thereby reduce distortion. Embodiments of the present invention also relate to circuits (e.g., amplifiers) that incorporate negative capacitance circuits for reducing distortion resulting from a gate-source (or base-emitter) capacitance of an output stage. Additionally, embodiments of the present invention relate to methods for reducing distortion resulting from a gate-source (or base-emitter) capacitance of an output stage.

In accordance with a specific embodiment of the present invention, an amplifier circuit includes an input stage and an output stage that is driven by the input stage, where the output stage has a gate-source (or base-emitter) capacitance that causes distortion. A negative capacitance circuit is connected in parallel with the gate-source (or base-emitter) capacitance of the output stage to shunt the gate-source (or base-emitter) capacitance of the output stage, and thereby reduce distortion. In accordance with an embodiment, the negative capacitance circuit includes at least two transistors, a resistor $R_C$ and a capacitor $C_1$, and has an input impedance $$Zin \approx -\frac{1}{j\omega C_1} - \frac{2}{gm} + R_C,$$

where gm is the transconductance of the transistors of the negative capacitance circuit. In a preferred embodiment, the resistor $R_C$ is selected so $$R_C \approx \left|\frac{2}{gm}\right|.$$

In accordance with specific embodiments of the present invention, the negative capacitance circuit includes a first transistor (Qn1, Qp1, Mn3 or Mp3), a second transistor (Qn2, Qp2, Mn4 or Mp4), a first bias current source (Ibias), a second bias current source (Ibias), a capacitor ($C_1$) and a resistor ($R_C$). The first transistor (Qn1, Qp1, Mn3 or Mp3) has a control terminal (base or gate) and a current path including a first current path terminal (collector or drain) and a second current path terminal (emitter or source), with the first current path terminal (collector or drain) of the first transistor connected to a first voltage rail (Vsp or GND). The second transistor (Qn2, Qp2, Mn4 or Mp4) has a control terminal (base or gate) and a current path including a first current path terminal (collector or drain) and a second current path terminal (emitter or source), with the first current path terminal (collector or drain) of the second transistor (Qn2, Qp2, Mn4 or Mp4) connected to the control terminal (base or gate) of the first transistor, and the control terminal (base or gate) of the second transistor receiving a bias voltage. The first bias current source (Ibias) is connected between the second current path terminal (emitter or source) of the first transistor and a second voltage rail (GND or Vsp). The second bias current source (Ibias) is connected between the second current path terminal (emitter or source) of the second transistor and the second voltage rail (GND or Vsp). The capacitor ($C_1$) is connected between the second current path terminal (emitter or source) of the first transistor and the second current path terminal (emitter or source) of the second transistor. The resistor ($R_C$) includes a first resistor terminal and a second resistor terminal, with the first resistor terminal connected to the control terminal (base or gate) of the first transistor and to the first current path terminal (collector or drain) of the second transistor, and the second resistor terminal forms the input node of the negative capacitance circuit.

In accordance with an embodiment of the negative capacitance circuit, the first and second transistors are bi-polar NPN transistors, the control terminals of the first and second transistors are bases, the first current path terminals of the first and second transistors are collectors, and the second current path terminals of the first and second transistors are emitters. In such an embodiment, the first voltage rail can be a positive supply voltage, and the second voltage rail can be a negative supply voltage or ground.

In accordance with an alternative embodiment, the first and second transistors are bi-polar PNP transistors, the control terminals of the first and second transistors are bases, the first current path terminals of the first and second transistors are collectors, and the second current path terminals of the first and second transistors are emitters. In such an embodiment, the first voltage rail can be a negative supply voltage or ground, and the second voltage rail can be a positive supply voltage.

In accordance with another embodiment, the first and second transistors are NMOS transistors, the control terminals of the first and second transistors are gates, the first current path terminals of the first and second transistors are drains, and the second current path terminals of the first and second transistors are sources. In such an embodiment, the first voltage rail can be a positive supply voltage, and the second voltage rail can be a negative supply voltage or ground.

In accordance with still another embodiment, the first and second transistors are PMOS transistors, the control terminals of the first and second transistors are gates, the first current path terminals of the first and second transistors are drains, and the second current path terminals of the first and second transistors are sources. In such an embodiment, the first voltage rail can be a negative supply voltage or ground, and the second voltage rail can be a positive supply voltage.

In a specific embodiment, the negative capacitance circuit also includes a voltage offset device (Voffset) that is used to further improve the above described circuits.

This summary is not intended to be a complete description of the embodiments of the present invention. Further and alternative embodiments, and the features, aspects, and advantages of the present invention will become more apparent from the detailed description set forth below, the drawings and the claims.

DETAILED DESCRIPTION

Embodiments of the present invention described below are useful for reducing, and preferably eliminating (or at least minimizing), the non-linearity (also referred to as distortion) that occurs primarily due to the gate-source (or base-emitter) capacitance of an output stage. More specifically, embodiments of the present invention are directed towards methods and circuits for synthesizing a negative capacitance, which can reduce the above mentioned distortion, which can be harmonic distortion. Accordingly, before discussing the embodiments of the present invention in detail, it is first useful to explain the concept of a negative capacitance.

The impedance (Z) of a normal positive capacitance can be expressed in frequency terms as $Z=1/j\omega C$, where j represents phase shift, and $\omega$ represents the capacitor's relationship with frequency, and C is the value of the capacitance. In contrast, the impedance of a negative capacitance can be represented as $Z=-1/j\omega C$, where C is a positive number. In general, a negative capacitance has a 90 degree phase difference between voltage and current, and its frequency response is linearly inversely proportional to voltage, where it's constant is negative. Stated another way, a terminal of negative capacitor acts like a normal positive capacitor in that when a voltage is applied, a resulting current that flows varies with frequency. However, with a negative capacitor, instead of the current flowing into the capacitor (as with a normal positive capacitor), the current flows out of the capacitor, which is indicative of the phase change.

Figure 1:
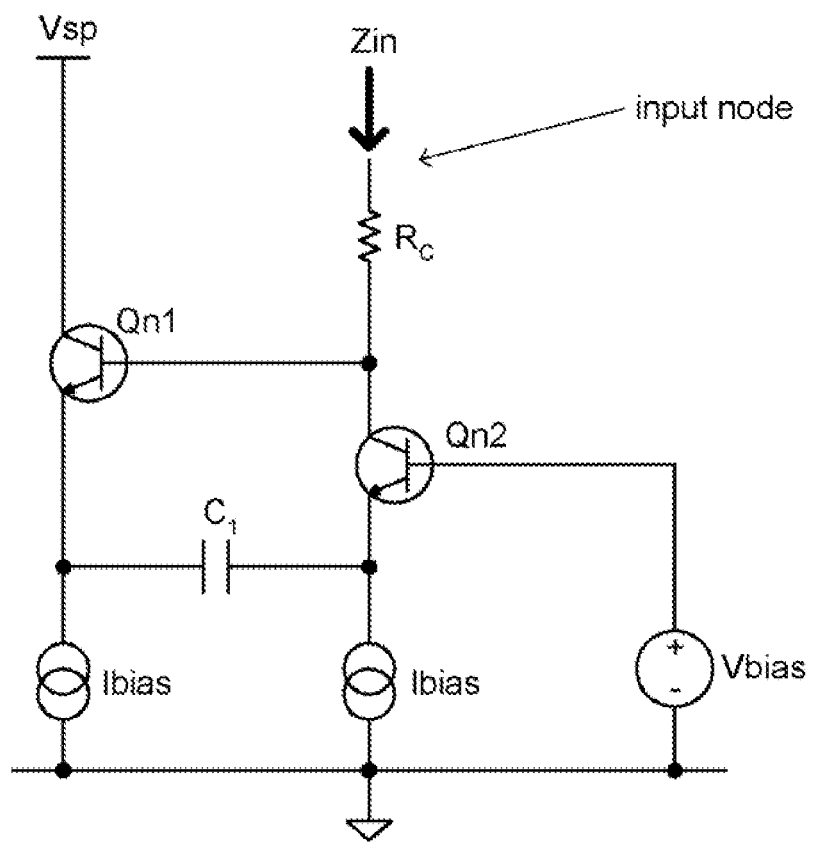
FIG. 1 shows a negative capacitance circuit, according to an embodiment of the present invention.

Referring now to FIG. 1, a negative capacitance circuit 100, according to an embodiment of the present invention, is shown. The circuit 100 includes NPN transistors Qn1 and Qn2, where the base of the transistor Qn1 is connected to the collector of the transistor Qn2. The collector of the transistor Qn1 is connected to a high voltage supply rail (Vsp), e.g., 3.3V or 5V. A capacitor $C_1$ is connected between the emitters of the transistors Qn1 and Qn2. The collector of the transistor Qn2 and the base of the transistor Qn1 are connected to a first terminal of a resistor $R_C$, with the resistor $R_C$ also including a second terminal that is considered the input node of the negative capacitance circuit 100. A current source (Ibias) is connected between the emitter of the transistor Qn1 and a low voltage supply rail. Similarly, a current source (Ibias) of preferably substantially the same magnitude is connected between the emitter of the transistor Qn2 and the low voltage supply rail. The bias current sources (Ibias) are used to appropriately bias the transistors Qn1 and Qn2. The low voltage supply rail (Vsm) can be ground, a negative voltage, or even a positive voltage that is lower than the high voltage supply rail (Vsp). Also shown is a voltage source (Vbias) that provides a bias voltage to the base of the transistor Qn2, which is used to set the DC bias point of the transistor Qn2, as well as to keeps the emitter of the transistor Qn2 constant (i.e., at Vbias minus the base-emitter voltage drop (Vbe) of the transistor Qn2).

The circuit 100 of FIG. 1 synthesizes a negative capacitance using a positive feedback loop that includes the transistor Qn1, the capacitor $C_1$ and the transistor Qn2. The input of the positive feedback loop can be considered the base of the transistor Qn1, and the output of the positive feedback loop can be considered the collector of the transistor Qn2, with the input and the output being tied together to perform the desired feedback. Stated another way, the AC voltage at the base of the transistor Qn1 is passed onto the emitter of the transistor Qn1, thus driving one terminal of the capacitor $C_1$. The other terminal of the capacitor $C_1$ is held at a constant voltage by the emitter of the transistor Qn2, with the constant voltage at the emitter of the transistor Qn2 being the fixed Vbias minus Vbe of the transistor Qn2. The current that flows through the capacitor $C_1$ is induced by the voltage variation on the emitter of the transistor Qn1, but flows to the input node through the emitter of the transistor Qn2.

The input impedance (Zin) at the input node of the negative capacitance circuit 100 is shown below.

$$Zin \approx -\frac{1}{j\omega C_1} - \frac{2}{gm} + R_C$$

where j represents phase shift, $\omega$ represents the angular frequency, and gm represents the transconductance of the transistors Qn1 and Qn2 (which preferably have substantially similar transconductance). To reduce Eq. 1 to $Z \approx -1/j\omega C$, chose $$R_C \approx \left|\frac{2}{gm}\right|.$$

Figure 2A:
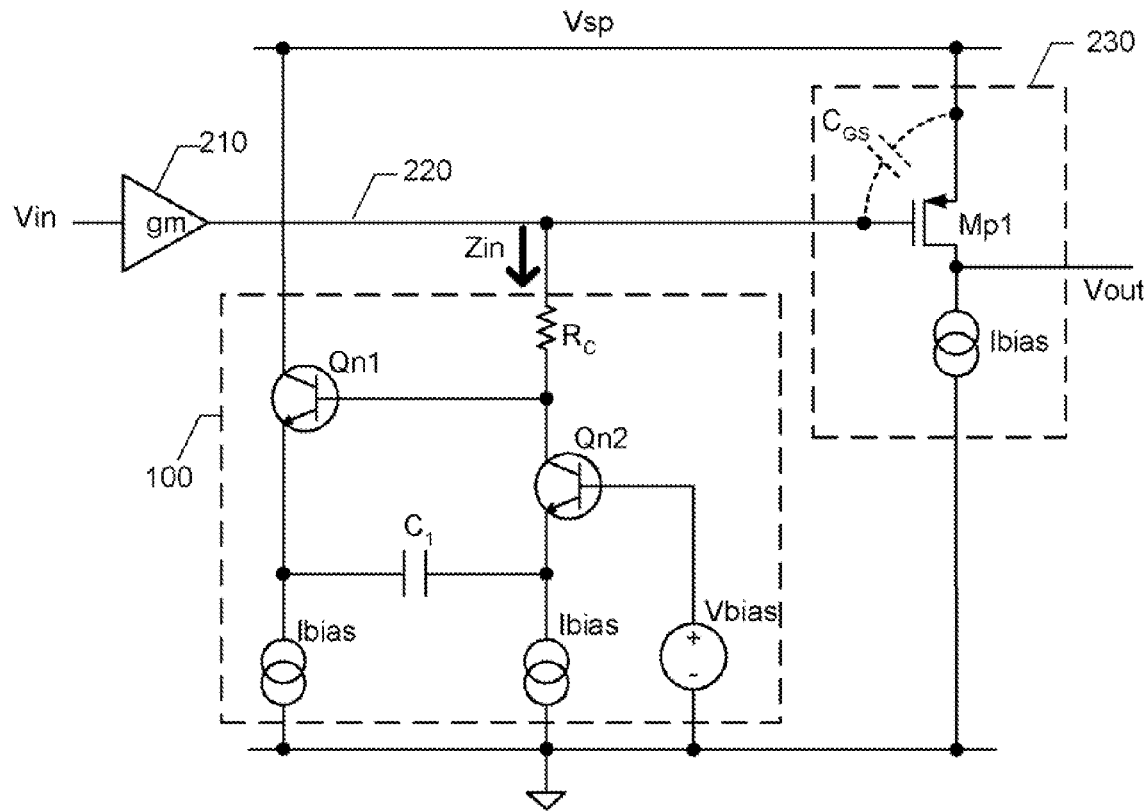
FIG. 2A illustrates how the negative capacitance circuit of FIG. 1 can be used to reduce distortion when an input stage is driving a PMOS type output stage.
Figure 2B:
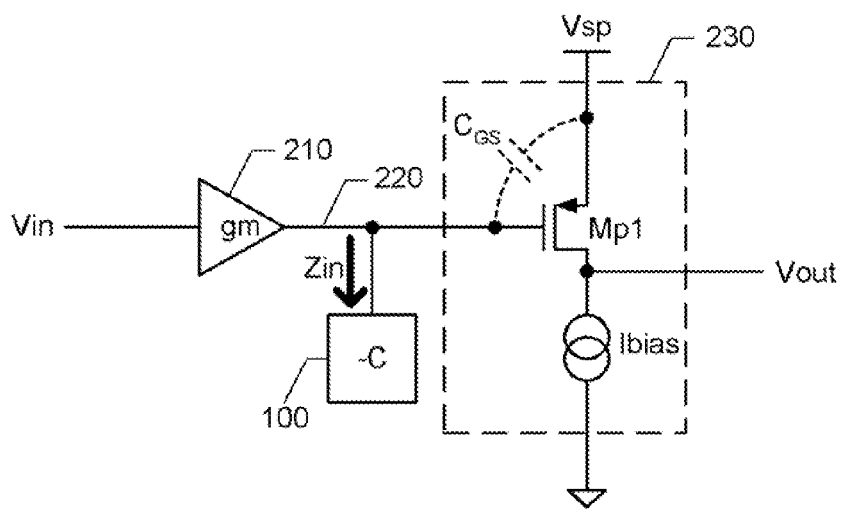
FIG. 2B is a simplified representation of FIG. 2A.

FIG. 2A illustrates how the negative capacitance circuit 100 can be used with an input stage 210 that is driving an output stage 230, to reduce distortion that results from the gate-source capacitance ($C_{GS}$) of the output stage 220. FIG. 2B is a simplified representation of FIG. 2A.

In FIGS. 2A and 2B the input stage 210 is shown to have a transconductance $gm_{in}$. The output stage 230 is shown as including a MOS output device, and more specifically a PMOS transistor Mp1. Square law characteristics will cause non-linearity in the gate-to-source voltage ($V_{GS}$) of the PMOS transistor Mp1. This will result in an error current, which is scaled by both the frequency and the gate-source capacitance ($C_{GS}$). Such a gate-source capacitance ($C_{GS}$) is represented in dashed line in FIGS. 2A and 2B, and the remaining FIGS. In accordance with embodiments of the present invention, the negative capacitance circuit 100 can be used to significantly reduce this scaling factor, thus improving (i.e., reducing) distortion. As shown in FIGS. 2A and 2B, this can be accomplished by connecting the negative capacitance circuit 100 in parallel with the gate-source capacitance ($V_{GS}$) of the output stage 230. Stated another way, the negative capacitance circuit 100 is applied so that it shunts the gate-source ($C_{GS}$) capacitance of the transistor Mp1 of the output stage 230. Because the negative capacitance circuit 100 is not placed in the signal path 220, it does not significantly affect high frequency signals that travel along the signal path 220.

Figure 3A:
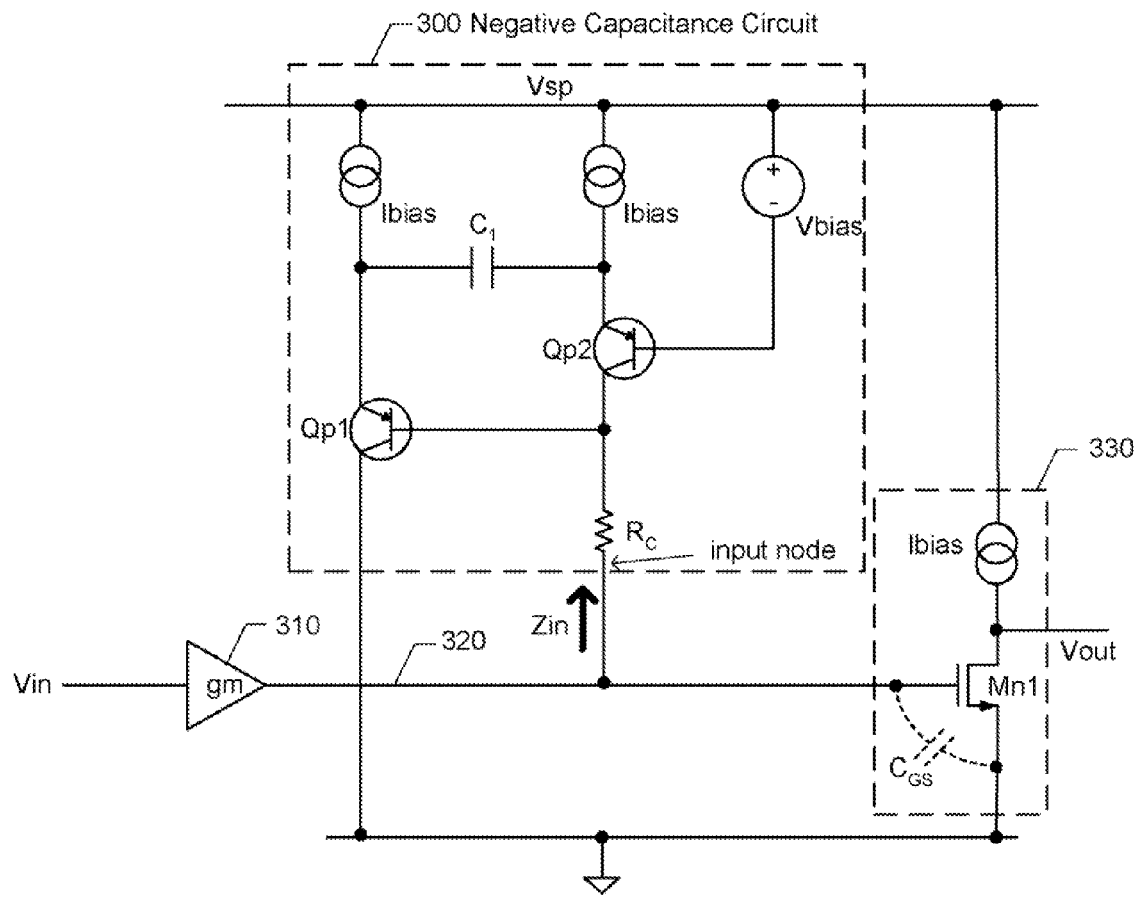
FIG. 3A illustrates how a negative capacitive circuit, according to another embodiment of the present invention, can be used to reduce distortion when an input stage is driving an NMOS type output stage.
Figure 3B:
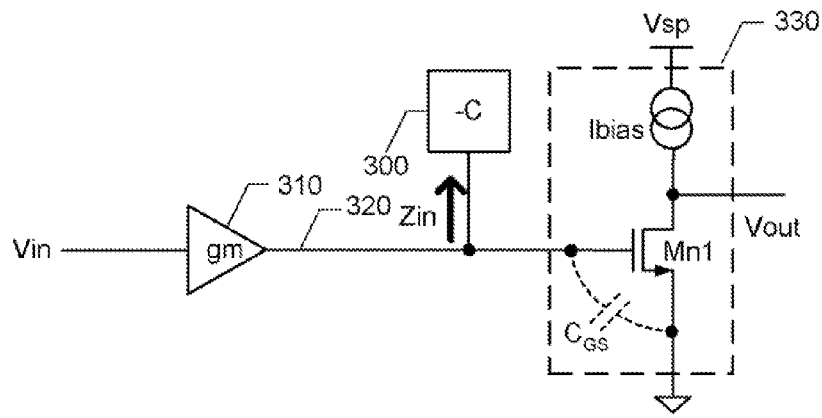
FIG. 3B is a simplified representation of FIG. 3A.

FIG. 3A illustrates an alternative negative capacitance circuit 300 to be used when the output stage 330 instead includes an NMOS type device(s), such as transistor Mn1. The circuit 300 includes PNP transistors Qp1 and Qp2, where the base of the transistor Qp1 is connected to the collector of the transistor Qp2. The collector of the transistor Qp1 is connected to a low voltage supply rail (Vsm). A capacitor $C_1$ is connected between the emitters of the transistors Qp1 and Qp2. The collector of the transistor Qp2 and the base of the transistor Qp1 are connected to a first terminal of a resistor $R_C$, with the resistor $R_C$ also including a second terminal that is considered the input node of the negative capacitance circuit 300. A current source (Ibias) is connected between the emitter of the transistor Qp1 and a high voltage supply rail (Vsp). Similarly, a current source (Ibias) of preferably substantially the same magnitude is connected between the emitter of the transistor Qp2 and the high voltage supply rail. The bias current sources (Ibias) are used to appropriately bias the transistors Qp1 and Qp2. The low voltage supply rail (Vsm) can be ground, a negative voltage, or even a positive voltage that is lower than the high voltage supply rail (Vsp). Also shown is a voltage source (Vbias) that provides a bias voltage to the base of the transistor Qp2, which is used to set the DC bias point of the transistor Qp2, as well as to keeps the emitter of the transistor Qp2 constant (i.e., at Vbias minus the base-emitter voltage drop (Vbe) of the transistor Qp2). The operation of circuit 300 is similar to that of circuit 100, and thus need not be explained again.

Figure 4A:
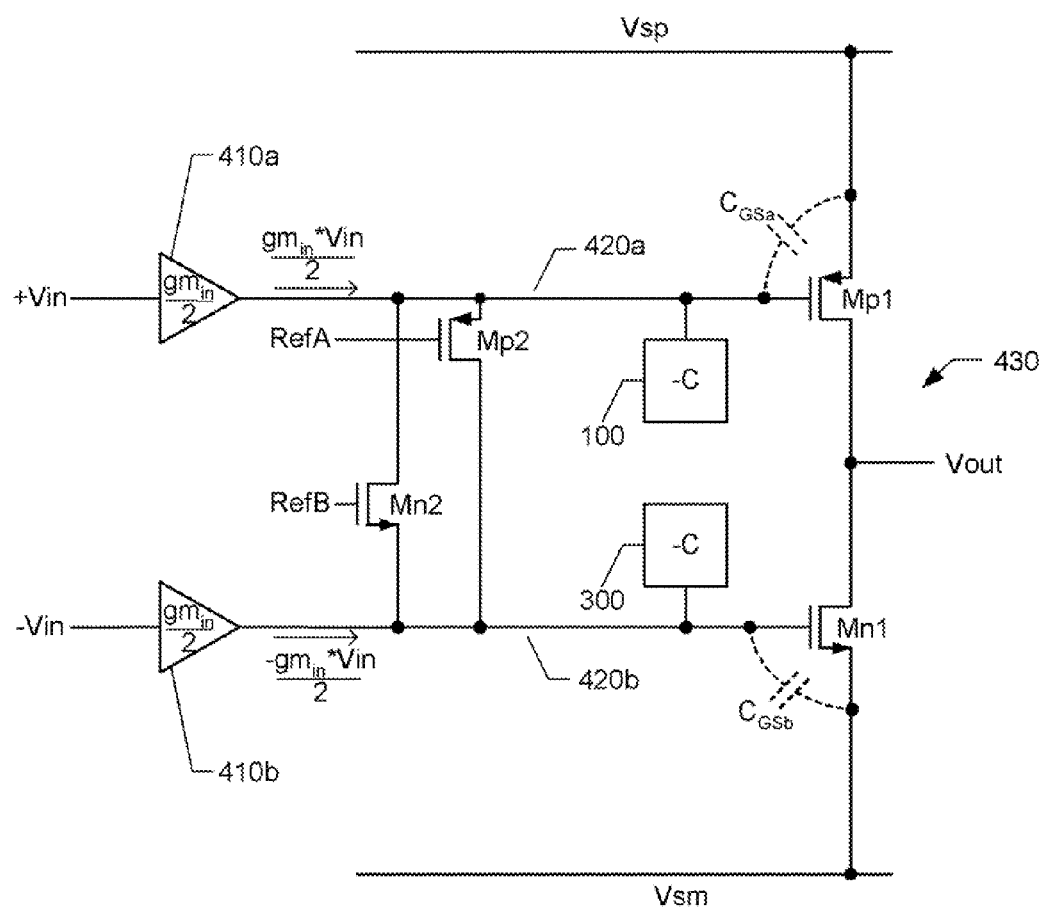
FIG. 4A illustrates how the negative capacitance circuit introduced in FIG. 1 and the negative capacitance circuit introduced in FIG. 3A can both be used to reduce distortion of class-AB output stage.

FIG. 4A illustrates a class-AB output stage 430 that is shown as including a pair of PMOS transistors Mp1 and Mp2, and a pair of NMOS transistors Mn1 and Mn2. The source of the transistor Mp1 is connected to the high voltage supply rail (Vsp), the source of the transistor Mn1 is connected to the low voltage supply rail (Vsm), and the drains of transistors Mp1 and Mn1 are connected together to form the output of the output stage 430. The source of the transistor Mp2 is connected to the gate of the transistor Mp1 and to the drain of the transistor Mn2. Similarly, the source of the transistor Mn2 is connected to the gate of the transistor Mn1 and to the drain of the transistor Mp2. The gate of the transistor Mp2 receives a reference voltage RefA, and the gate of the transistor Mn2 receives a reference voltage RefB. Currents gm*Vin/2 and −gm*Vin/2, are provided by input stage portions 410a and 410b (which collectively form an input stage), to the class-AB output stage 430. The output of the class-AB output stage 430, as mentioned above, is provided at the drains of the transistors Mp1 and Mn1.

For the class-AB output stage 430, distortion results from the gate-source capacitance of the PMOS transistor Mp1 and the gate-source capacitance of the NMOS transistor Mn1. Accordingly, to reduce such distortion, the negative capacitance circuit 100 is placed in parallel with the gate-source capacitance of the PMOS transistor Mp1, and the negative capacitance circuit 300 is placed in parallel with the gate-source capacitance of the NMOS transistor Mn1, to shunt such gate-source capacitances.

Figure 4B:
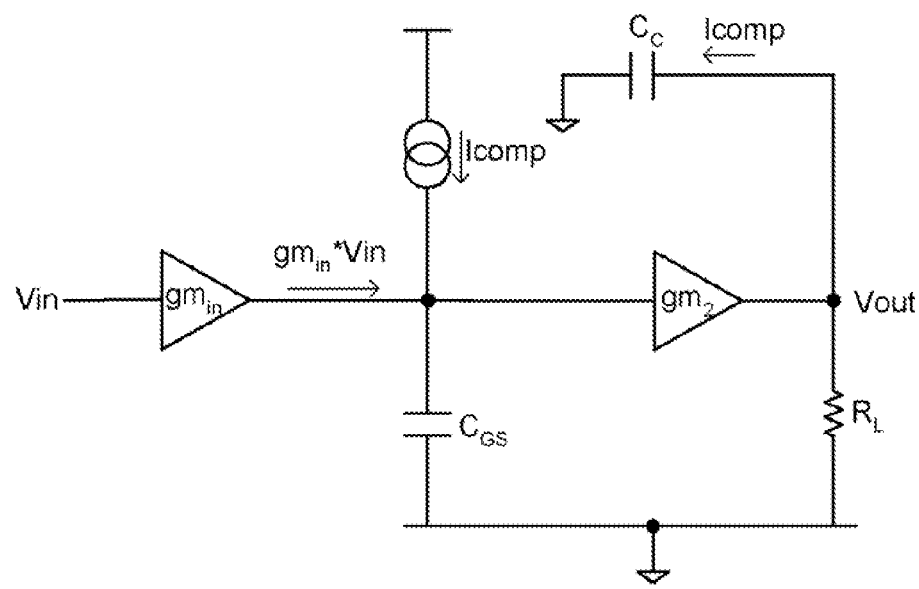
FIG. 4B, which illustrates a generalized small signal model of a two stage amplifier, is used to illustrate how a negative capacitance can be used to reduce a non-linear equation to an essentially linear equation.

Using the negative capacitance circuits 100 and 300 of embodiments of the present invention, the harmonic distortion of the class-AB output state 430 shown in FIG. 4A is significantly reduced, e.g., by up to 31 dB at the $2^{nd}$ harmonic, and up to 7 dB at the $3^{rd}$ harmonic. For an AC model, midband Vout/Vin is in theory completely linearized. To demonstrate this, FIG. 4B shows a generalized small signal model of a two stage amplifier where a compensation capacitor ($C_C$) is connected between the output (Vout) and an AC ground. The capacitor current is fed back to the input of a second stage having a transconductance ($gm_2$). In this general case, the equation Vout/Vin is shown below.

$$\frac{Vout}{Vin} \approx -\frac{gm_{in}}{j\omega C_C}\left[\frac{1}{1+\dfrac{C_{GS}}{C_C gm_2 R_L}+\dfrac{j\omega C_{GS}}{gm_2}}\right].$$

The addition of the negative capacitance circuit in parallel with $C_{GS}$, with a magnitude approximately equal to $|C_{GS}|$, essentially reduces the above equation to the linear equation $$\frac{Vout}{Vin} \approx -\frac{gm_{in}}{j\omega C_C}.$$

Figure 5:
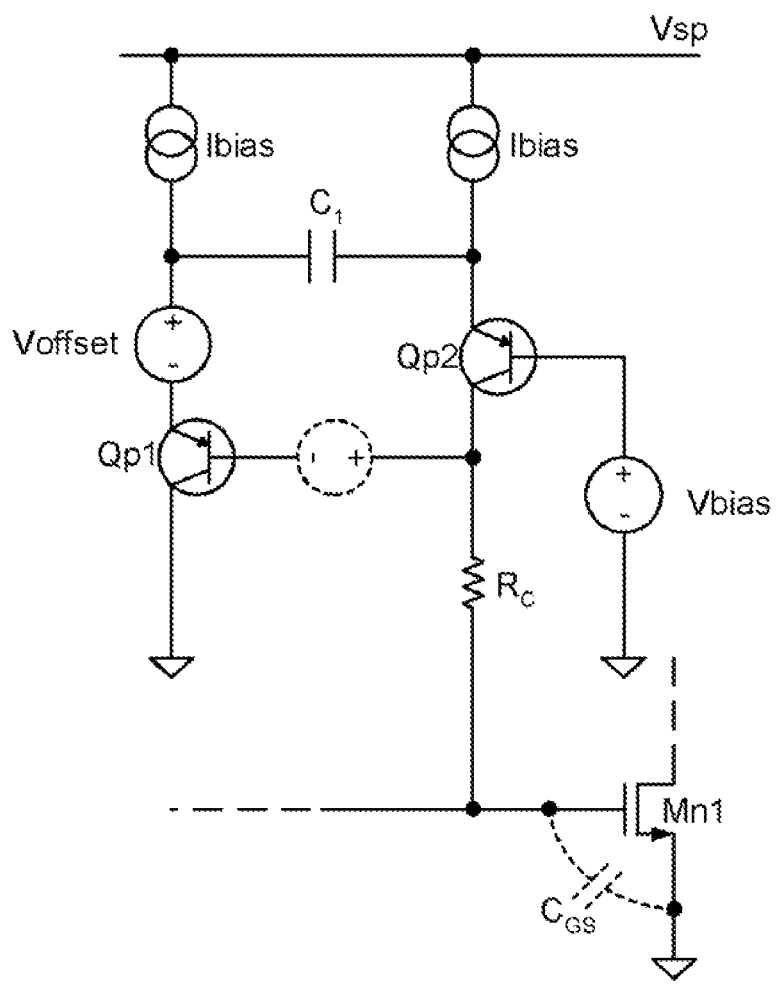
FIG. 5 illustrates how a voltage offset can be added to the above FIGS. to reproduce the bias across $C_{GS}$ on $C_1$ to improve performance.

The circuit of FIG. 5 illustrates that a voltage offset (Voffset) can be added to any of the circuits discussed above, to improve such circuits. The value of the actual gate-source capacitance ($C_{GS}$) of an output stage is voltage dependent (i.e., value of capacitance depends on the voltage across it). The Voffset can be used to compensate for this. More specifically, if Vbias, Ibias, Voffset and $R_C$ are selected such that Vbias≈Voffset+IbiasRc, then the voltage across $C_1$ will be approximately equal to the voltage across $C_{GS}$, which will result in better cancellation of $C_{GS}$ by the negative capacitance circuit. In accordance with an alternative embodiment of the present invention, Voffset can be at the base of the transistor Qp1, as shown in dashed line in FIG. 5.

In accordance with specific embodiments of the present invention, where the output stage includes a MOS device(s), the capacitor $C_1$ shown in the FIGS. is preferably an oxide capacitor, to enable it to mimic the $C_{GS}$ of the output stage. For example, an actual MOS device capacitor can be used, but is not necessary. The capacitor $C_1$ can be a single capacitor, or a network of more than one capacitor device, if desired. In other words, use of the term capacitor does not mean that only a single capacitor is used.

The output stages 230, 330 and 430 described with reference to the above FIGS are relatively simple output stages. However, one of ordinary skill in the art would readily appreciate that embodiments of the present invention can also be used with more complex output stages than shown.

Figure 6A:
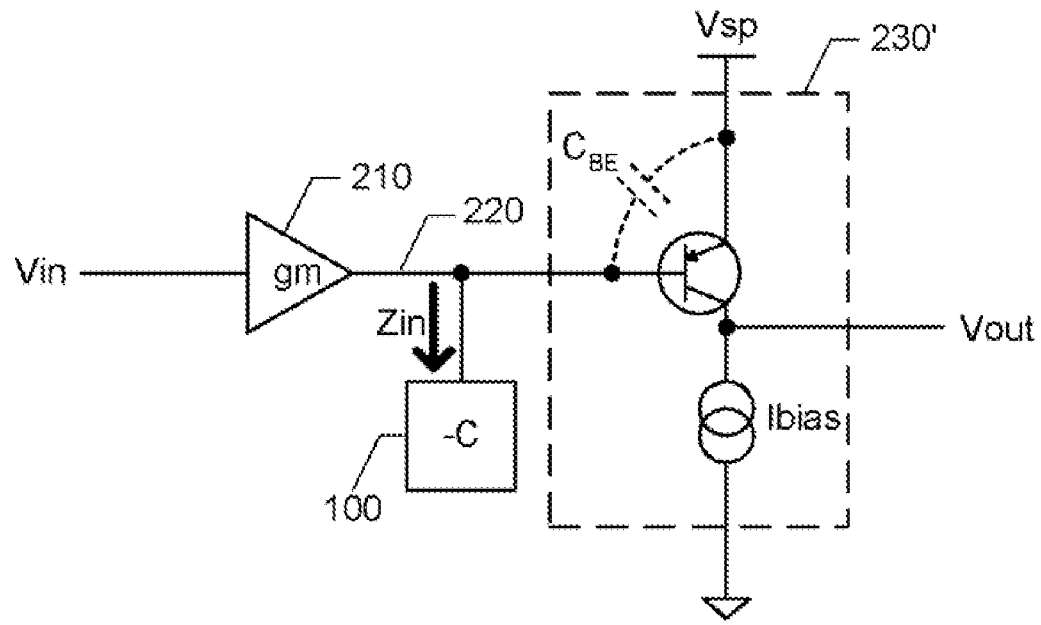
FIGS. 6A, 6B and 6C illustrate how the MOS type output stages shown in the above FIGS. can instead be BJT type output stages.
Figure 6B:
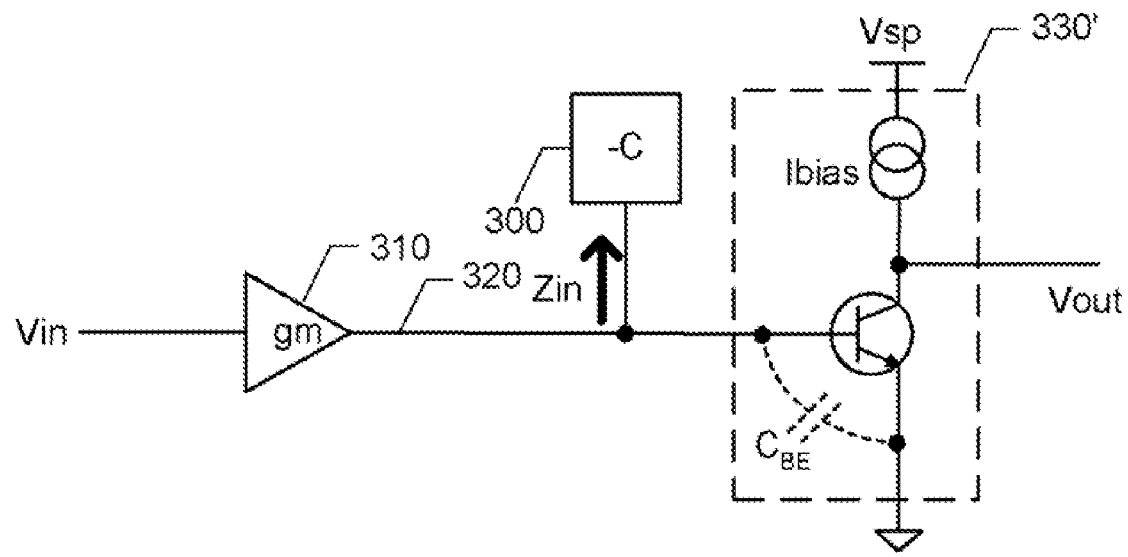
Figure 6C:
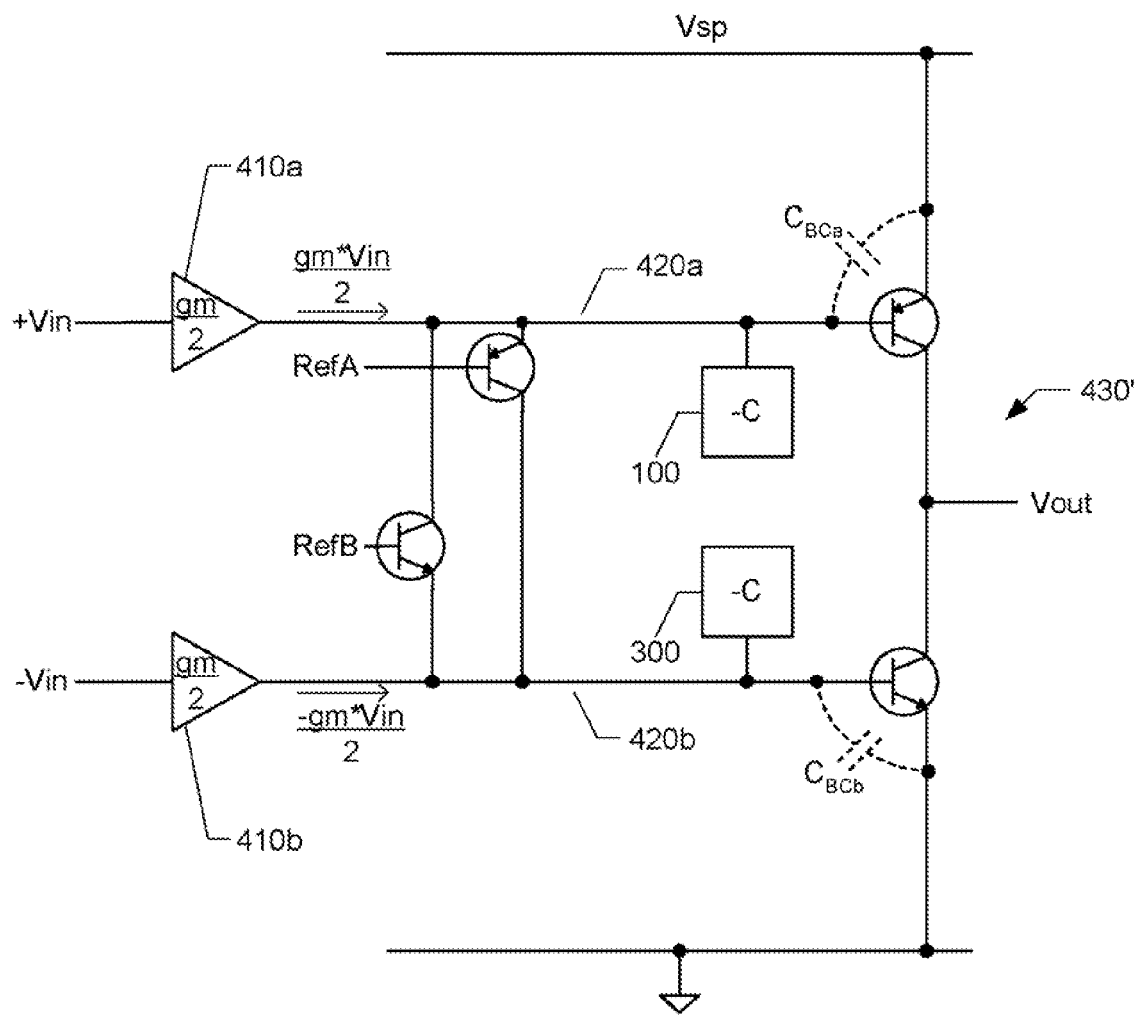

While embodiments of the present invention are most beneficial when the output stage is or includes one or more MOS device, such as PMOS device Mp1 and/or NMOS device Mn1, embodiments of the present invention can also be used where the output stage is or includes one or more bi-polar junction (BJT) device (e.g., a PNP transistor and/or an NPN transistor). Exemplary output stages 230', 330' and 430' that include BJT devices are shown in FIGS. 6A, 6B and 6C. Where the output stages include BJTs, the distortion would be due to base-emitter capacitance ($C_{BE}$) of the output stage. Regardless of the type of output stage, it is likely that an output of an input stage is driving a control terminal (gate or base) of a transistor of the output stage.

Figure 7A:
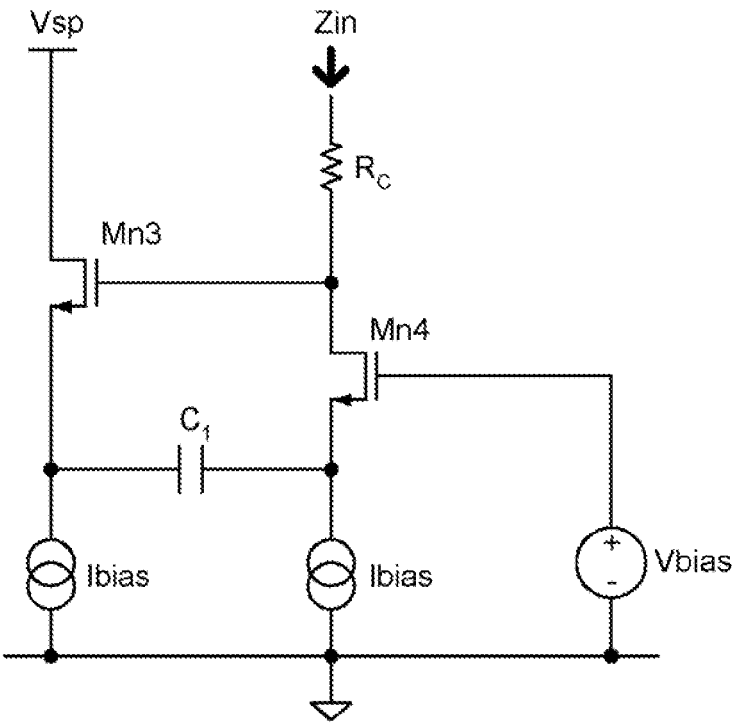
FIGS. 7A and 7B illustrate how the BJT type negative capacitance circuits shown in the above FIGS. can be replaced with MOS type negative capacitance circuits.
Figure 7B:
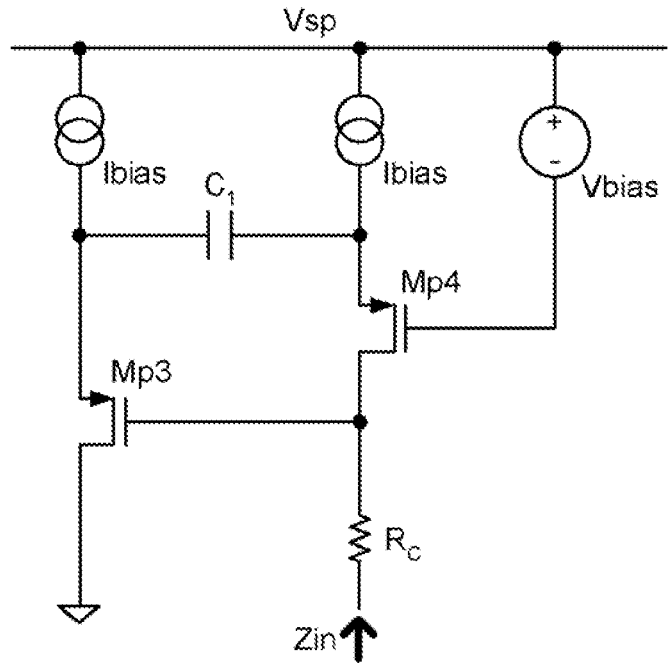

While it is preferred that the negative capacitance circuits 100 and 200 include BJT transistors, in alternative embodiments of the present invention shown in FIGS. 7A and 7B, negative capacitance circuits 100' and 200' include MOS transistors in place of the BJT transistors.

An advantage of embodiments of the present invention is that the negative capacitance circuits are not placed in a signal path (e.g., 220, 320, 420). Thus, high frequency effects are not critical. Further, the negative capacitance circuits of the present invention have a very low current consumption, e.g., on the order of about 200 μA.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. An amplifier circuit, comprising:
an input stage;
an output stage that is driven by the input stage, the output stage having one of a gate-source capacitance and a base-emitter capacitance that can cause distortion, wherein the one of the gate-source capacitance and the base-emitter capacitance has a voltage dependency; and
a negative capacitance circuit connected in parallel with the one of the gate-source capacitance and the base-emitter capacitance of the output stage to shunt the one of the gate-source capacitance and the base-emitter capacitance of the output stage, wherein the negative capacitance circuit produces an offset voltage to compensate for the voltage dependency of the one of the gate-source capacitance and the base-emitter capacitance.

2. The amplifier circuit of claim 1, wherein the negative capacitance circuit reduces distortion caused by the one of the gate-source capacitance and the base-emitter capacitance of the output stage.

3. An amplifier circuit, comprising:
an input stage;
an output stage that is driven by the input stage, the output stage having one of a gate-source capacitance and a base-emitter capacitance; and
a negative capacitance circuit connected in parallel with the one of the gate-source capacitance and the base-emitter capacitance of the output stage to shunt the one of the gate-source capacitance and the base-emitter capacitance of the output stage;
wherein the negative capacitance circuit includes at least two transistors, a resistor $R_C$ and a capacitor $C_1$, and has an input impedance $$Zin \approx -\frac{1}{j\omega C_1} - \frac{2}{gm} + R_C,$$

where
gm is the transconductance of the transistors of the negative capacitance circuit, and $$R_C \approx \left|\frac{2}{gm}\right|.$$

4. The amplifier circuit of claim 1, wherein:
the one of the gate-source capacitance and the base-emitter capacitance is the gate-source capacitance;
the output stage comprises an output stage transistor (Mp1 or Mn1) including a gate, a source and a drain;
the gate-source capacitance is between the gate and the source of the output stage transistor (Mp1 or Mn1); and
the drain of the output stage provides an output of the amplifier circuit.

5. An amplifier circuit, comprising:
an input stage;
an output stage that is driven by the input stage, the output stage having a gate-source capacitance; and
a negative capacitance circuit connected in parallel with the gate-source capacitance of the output stage to shunt the gate-source capacitance of the output stage;
wherein the output stage comprises an output stage transistor (Mp1 or Mn1) including a gate, a source and a drain;
wherein the gate-source capacitance is between the gate and the source of the output stage transistor (Mp1 or Mn1);
wherein the drain of the output stage provides an output of the amplifier circuit; and
wherein the negative capacitance circuit comprises:
a first transistor (Qn1, Qp1, Mn3 or Mp3) having a control terminal (base or gate) and a current path including a first current path terminal (collector or drain) and a second current path terminal (emitter or source), the first current path terminal (collector or drain) of the first transistor connected to the source of the output stage transistor (Mp1 or Mn1);
a second transistor (Qn2, Qp2, Mn4 or Mp4) having a control terminal (base or gate) and a current path including a first current path terminal (collector or drain) and a second current path terminal (emitter or source), the first current path terminal (collector or drain) of the second transistor connected to the control terminal (base or gate) of the first transistor, and the control terminal (base or gate) of the second transistor receiving a bias voltage;
a first bias current source (Ibias) connected between the second current path terminal (emitter or source) of the first transistor and a voltage rail (Vsm or Vsp);

a second bias current source (Ibias) connected between the second current path terminal (emitter or source) of the second transistor and the second voltage rail (Vsm or Vsp);

a capacitor (C1) connected between the second current path terminal (emitter or source) of the first transistor and the second current path terminal (emitter or source) of the second transistor; and a resistor (RC) including a first resistor terminal and second resistor terminal, the first resistor terminal connected to the control terminal (base or gate) of the first transistor and to the first current path terminal (collector or drain) of the second transistor, and the second resistor terminal connected to the gate of the output stage transistor (Mp1 or Mn1).

6. The amplifier circuit of claim 5, wherein the first current path terminal (collector or drain) of the first transistor and the source of the output stage transistor (Mp1 or Mn1) are connected to a further voltage rail (Vsp or Vsm).

7. The amplifier circuit of claim 6, wherein:
the voltage rail is a negative supply voltage or ground; and
the further voltage rail is a positive supply voltage.

8. The amplifier circuit of claim 6, wherein:
the voltage rail is a positive supply voltage; and
the further voltage rail is a negative supply voltage or ground.

9. An amplifier circuit, comprising:
an input stage;
an output stage that is driven by the input stage, the output stage having a gate-source capacitance; and
a negative capacitance circuit connected in parallel with the gate-source capacitance of the output stage to shunt the gate-source capacitance of the output stage;
wherein the output stage comprises an output stage transistor (Mp1 or Mn1) including a gate, a source and a drain;
wherein the gate-source capacitance is between the gate and the source of the output stage transistor (Mp1 or Mn1);
wherein the drain of the output stage provides an output of the amplifier circuit; and
wherein the negative capacitance circuit comprises:
first and second transistors, each including a control terminal (base or gate) and a current path including a first current path terminal (collector or drain) and a second current path terminal (emitter or source), the first current path terminal (collector or drain) of the first transistor connected to the source of the output stage transistor (Mp1 or Mn1);
first and second bias current sources configured to bias the first and second transistors;
a capacitor ($C_1$) connected between the second current path terminal (emitter or source) of the first transistor and the second current path terminal (emitter or source) of the second transistor; and
a resistor ($R_C$) including a first resistor terminal and second resistor terminal, the first resistor terminal connected to the control terminal (base or gate) of the first transistor and to the first current path terminal (collector or drain) of the second transistor, and the second resistor terminal connected to the gate of the output stage transistor (Mp1 or Mn1).

10. The amplifier circuit of claim 9, wherein the first current path terminal (collector or drain) of the first transistor and the source of the output stage transistor (Mp1 or Mn1) are connected to a further voltage rail (Vsp or Vsm).

11. The amplifier circuit of claim 9, further comprising:
a voltage offset device (Voffset), connected between the second current path terminal of the first transistor and one of two terminals of the first capacitor terminal, or connected between the control terminal of the first transistor and the first current path terminal of the second transistor; and
wherein the bias voltage provided to the control terminal of the second transistor is equal to or substantially equal to the offset voltage, provided by the voltage offset device (Voffset), plus a voltage drop across the resistor ($R_C$).

12. A method for use with an amplifier circuit including an output stage having one of a gate-source capacitance and a base-emitter capacitance that can cause distortion, wherein the one of the gate-source capacitance and the base-emitter capacitance has a voltage dependency, the method comprising:

(a) providing a negative capacitance circuit configured to produce an offset voltage; and (b) connecting the negative capacitance circuit in parallel with the one of the gate-source capacitance and the base-emitter capacitance of the output stage; and (c) compensating for the voltage dependency of the one of the gate-source capacitance and the base-emitter capacitance using the offset voltage produced by the negative capacitance circuit.

13. The method of claim 12, wherein the negative capacitance circuit connected at step (b) shunts the one of the gate-source capacitance and the base-emitter capacitance to thereby reduce distortion caused by the one of the gate-source capacitance and the base-emitter capacitance.

14. An amplifier circuit, comprising:
an input stage;
an output stage that is driven by the input stage, the output stage having a base-emitter capacitance that causes distortion; and
a negative capacitance circuit connected in parallel with the base-emitter capacitance of the output stage to shunt the base-emitter capacitance of the output stage;
wherein the output stage comprises an output stage transistor including a base, an emitter and a collector;
wherein the base-emitter capacitance is between the base and the emitter of the output stage transistor;
wherein the collector of the output stage provides an output of the amplifier circuit; and
wherein the negative capacitance circuit comprises:
a first transistor (Qn1, Qp1, Mn3 or Mp3) having a control terminal (base or gate) and a current path including a first current path terminal (collector or drain) and a second current path terminal (emitter or source), the first current path terminal (collector or drain) of the first transistor connected to the emitter of the output stage transistor;
a second transistor (Qn2, Qp2, Mn4 or Mp4) having a control terminal (base or gate) and a current path including a first current path terminal (collector or drain) and a second current path terminal (emitter or source), the first current path terminal (collector or drain) of the second transistor connected to the control terminal (base or gate) of the first transistor, and the control terminal (base or gate) of the second transistor receiving a bias voltage;

a first bias current source (Ibias) connected between the second current path terminal (emitter or source) of the first transistor and a voltage rail (Vsm or Vsp);

a second bias current source (Ibias) connected between the second current path terminal (emitter or source) of the second transistor and the second voltage rail (Vsm or Vsp);

a capacitor ($C_1$) connected between the second current path terminal (emitter or source) of the first transistor and the second current path terminal (emitter or source) of the second transistor; and a resistor ($R_C$) including a first resistor terminal and second resistor terminal, the first resistor terminal connected to the control terminal (base or gate) of the first transistor and to the first current path terminal (collector or drain) of the second transistor, and the second resistor terminal connected to the base of the output stage transistor.

15. The amplifier circuit of claim 14, wherein the first current path terminal (collector or drain) of the first transistor and the emitter of the output stage transistor are connected to a further voltage rail (Vsp or Vsm).

16. The amplifier circuit of claim 15, wherein:
the voltage rail is a negative supply voltage or ground; and
the further voltage rail is a positive supply voltage.

17. The amplifier circuit of claim 15, wherein:
the voltage rail is a positive supply voltage; and
the further voltage rail is a negative supply voltage or ground.

18. The amplifier circuit of claim 14, further comprising:
a voltage offset device (Voffset), connected between the second current path terminal of the first transistor and one of two terminals of the first capacitor terminal, or connected between the control terminal of the first transistor and the first current path terminal of the second transistor; and
wherein the bias voltage provided to the control terminal of the second transistor is equal to or substantially equal to the offset voltage, provided by the voltage offset device (Voffset), plus a voltage drop across the resistor ($R_C$).

19. An amplifier circuit, comprising:
an input stage;
an output stage that is driven by the input stage, the output stage having a base-emitter capacitance that causes distortion; and
a negative capacitance circuit connected in parallel with the base-emitter capacitance of the output stage to shunt the base-emitter capacitance of the output stage;
wherein the output stage comprises an output stage transistor including a base, an emitter and a collector;
wherein the base-emitter capacitance is between the base and the emitter of the output stage transistor;
wherein the collector of the output stage provides an output of the amplifier circuit; and
wherein the negative capacitance circuit comprises:
first and second transistors, each including a control terminal (base or gate) and a current path including a first current path terminal (collector or drain) and a second current path terminal (emitter or source), the first current path terminal (collector or drain) of the first transistor connected to the emitter of the output stage transistor;
first and second bias current sources configured to bias the first and second transistors;
a capacitor (C1) connected between the second current path terminal (emitter or source) of the first transistor and the second current path terminal (emitter or source) of the second transistor; and
a resistor (RC) including a first resistor terminal and second resistor terminal, the first resistor terminal connected to the control terminal (base or gate) of the first transistor and to the first current path terminal (collector or drain) of the second transistor, and the second resistor terminal connected to the base of the output stage transistor.

20. The amplifier circuit of claim 19, wherein the first current path terminal (collector or drain) of the first transistor and the emitter of the output stage transistor are connected to a further voltage rail (Vsp or Vsm).

* * * * *